United States Patent
Acklin et al.

(10) Patent No.: US 6,960,033 B1
(45) Date of Patent: Nov. 1, 2005

(54) ARRAY WITH LIGHT-EMITTING POWER SEMICONDUCTOR COMPONENT AND CORRESPONDING PRODUCTION METHOD

(75) Inventors: Bruno Acklin, Regensburg (DE); Werner Späth, Holzkirchen (DE); Stefan Grötsch, Regensburg (DE)

(73) Assignee: Osram GmbH, (DE)

( * ) Notice: Subject to any disclaimer, the term of this patent is extended or adjusted under 35 U.S.C. 154(b) by 0 days.

(21) Appl. No.: 09/786,699

(22) PCT Filed: Sep. 1, 1999

(86) PCT No.: PCT/DE99/02750

§ 371 (c)(1),
(2), (4) Date: May 14, 2001

(87) PCT Pub. No.: WO00/14837

PCT Pub. Date: Mar. 16, 2000

(30) Foreign Application Priority Data

Sep. 9, 1998   (DE) ................ 198 41 204

(51) Int. Cl.$^7$ .............................. G02B 6/36
(52) U.S. Cl. ................ 385/94; 385/91; 385/92; 385/93; 372/6; 372/38; 372/50; 437/211
(58) Field of Search ............ 385/94, 93, 92, 385/91, 38; 372/6, 36, 50, 38; 437/211

(56) References Cited

U.S. PATENT DOCUMENTS

| | | | |
|---|---|---|---|
| 4,387,385 A | * 6/1983 | Thillays et al. ............ 257/88 |
| 5,218,611 A | 6/1993 | Tanaka et al. ............. 372/36 |
| 5,268,978 A | * 12/1993 | Po et al. .................... 385/33 |
| 5,307,362 A | 4/1994 | Tanaka et al. ............. 372/50 |
| 5,309,460 A | 5/1994 | Fujimaki et al. .......... 372/36 |
| 5,311,535 A | 5/1994 | Karpinski .................. 372/50 |
| 5,327,443 A | 7/1994 | Tanaka et al. ............. 372/36 |
| 5,516,727 A | 5/1996 | Broom ..................... 437/211 |
| 5,548,605 A | 8/1996 | Benett et al. .............. 372/36 |
| 5,668,903 A | 9/1997 | Neuberger et al. ......... 385/38 |

FOREIGN PATENT DOCUMENTS

| | | |
|---|---|---|
| DE | 3736026 | 5/1989 |
| DE | 43 15 580 A1 | 11/1994 |
| DE | 4003842 | 6/1997 |
| DE | 197 06 279 A1 | 8/1998 |
| EP | 0 450 560 A2 | 10/1991 |
| EP | 0 589 711 A2 | 3/1994 |
| EP | 0 592 746 A1 | 4/1994 |
| EP | 0 869 590 A1 | 10/1998 |

OTHER PUBLICATIONS

Sawai Masaaki; Japanese abstract, publication No. 60217687, publication date Oct. 10, 1985.

* cited by examiner

*Primary Examiner*—Robert H. Kim
*Assistant Examiner*—George Y. Wang
(74) *Attorney, Agent, or Firm*—Fish & Richardson P.C.

(57) ABSTRACT

A light-emitting power semiconductor device is placed on a metillic substrate structure with the formation of a good heat-transfer contact, in which a plastic protective body surrounds the power semiconductor device, leaving exposed a light exit region in the nature of a cap.

26 Claims, 2 Drawing Sheets

ARRAY WITH LIGHT-EMITTING POWER SEMICONDUCTOR COMPONENT AND CORRESPONDING PRODUCTION METHOD

This national stage application of PCT/DE99/02750, filed Sep. 1, 1999 claims priority under 35 USC 119 of the priority application, German 198 41 204.5, filed Sep. 9, 1998.

BACKGROUND OF THE INVENTION

The invention concerns an arrangement comprising a light-emitting power semiconductor device according to the preamble of claim 1 and a method for fabricating such an arrangement as recited in claim 17.

BRIEF SUMMARY OF THE INVENTION

It is already known to mount a light-emitting power semiconductor device, especially a semiconductor laser, on a copper plate and to couple the copper plate to a water cooling system for efficient dissipation of the waste heat generated in the power semiconductor device. The connection between the copper plate and the power semiconductor device can be made by soldering or gluing.

It is further already known to place the power semiconductor device of such an arrangement in a housing to protect it against environmental influences. The housing is usually formed by the copper plate itself and a metal cap seated on the copper plate and surrounding the power semiconductor device.

The difficulties that arise in practice with this known solution chiefly relate to the thermal and/or mechanical coupling of the power semiconductor device to the heat sink (copper plate) and the decoupling of the useful optical output from the housing. In regard to the first aspect, problems are created by the large difference (roughly a factor of 3) that exists between the thermal expansion coefficients of the commonly used semiconductor materials (e.g. GaAs) and the thermal expansion coefficient of copper. This creates the risk that the connecting structure (solder or glue, for example) between the power semiconductor device and the copper plate may deteriorate mechanically over time, causing the heat-transmission resistance to increase and, in the extreme case, the power semiconductor device to pop off. In regard to the second aspect, in order to couple the optical laser output out of the housing it is necessary to have an exit window, optionally provided with a lens, or, when an optical waveguide is being used, a waveguide feedthrough through the metal cap. In practice, such arrangements are not uncommonly associated with calibration problems.

Furthermore, it is disadvantageous that the aforesaid arrangement is relatively costly to manufacture because of the metal-cap-type housing provided with a light exit window or a waveguide feedthrough, and requires an onerous assembly operation.

Document DE 197 06 279 A1 describes a laser device comprising a power semiconductor device attached to a metallic base substrate. Disposed on the metallic base substrate is a housing cover that comprises a transparent light exit region.

European patent application EP 0 869 590 A1 describes a vertical-resonator laser diode placed in a housing whose floor, walls and ceiling are made of a plastic material. An output monitoring system is integrated into the ceiling of the housing.

Document U.S. Pat. No. 5,327,443 describes a power semiconductor laser mounted on a metallic heat sink and surrounded by a cap-like housing cover. The housing cover can be realized as a one-piece injection-molded plastic part and comprises a transparent light exit window.

European patent application EP 0 592 746 A1 describes a laser arrangement in which a laser diode and an optical waveguide are cast together with a casting resin. The laser diode is form-fittingly shrouded in the cast-resin coating except on a light exit surface.

The object of the invention is to provide an arrangement that is of simple construction and is inexpensive to manufacture, comprising a housed, light-emitting power semiconductor device protected against environmental influences. The invention is further intended to provide a method for fabricating such an arrangement that is simple from a production engineering standpoint and can be performed at low cost.

The underlying object of the invention is accomplished by means of the features of claims 1 and 17.

In accordance with the invention, the power semiconductor device is housed in a plastic protective body, the dissipation of waste heat taking place primarily via the metallic substrate structure. The plastic protective body is made simply by injecting a hardenable plastic mass onto the prefabricated substrate structure in such a way that said structure is coated substantially form-fittingly except on the light exit region. The uncoated light exit region can be obtained, for example, by means of a sacrificial part that is appropriately positioned before the injection step and is subsequently removed, or by means of an optical waveguide. The metal cap used as a housing in the prior art is unnecessary. The basic advantage of the design according to the invention is that it can be produced in a simple and inexpensive manner and yet satisfies the practical requirements with regard to the dissipation of waste thermal power and the coupling-out of the useful optical output.

The plastic protective body is preferably made of a substantially opaque plastic material. Optically transparent plastics have, for the most part, been found to exhibit much poorer adaptation to the thermal expansion of the power semiconductor device during operation. The incorporation of dispersed filler particles, especially glass particles, into the plastic protective body can favorably affect and, in some cases, further improve the thermal adaptation between the power semiconductor device and the plastic protective body.

The plastic protective body can advantageously be made from either a thermoplast or a duroplast; in practice, plastic protective bodies made from thermoplasts have proven to be especially suitable. However, other plastic materials, for example casting resins or globe-top masses, have also been used to create the plastic protective body.

The substrate structure is preferably a singulated part, particularly a stamped part, fabricated of sheet metal, particularly a lead frame. Lead frames are widely used as substrates for conventional electronic components and can be manufactured inexpensively in large runs with existing production techniques. According to a preferred embodiment of the invention, the substrate structure is in thermal contact with a coolant, particularly water, which flows around or across at least a portion of its surface. In this way, an adequate cooling effect can be achieved even with comparatively thin-walled substrate structures. The coolant can also be omitted, however. In this case, heat is removed from the power semiconductor device via the solid heat dissipator, along or through the substrate structure. The substrate structure must then be held mechanically in a suitable manner via a connection that conducts heat (away) effectively.

A variant embodiment is characterized by the fact that the substrate structure is provided with a heat-exchange body comprising microchannels and/or microplates. Such microcoolers are known per se and are described, for example, in DE 43 15 580 A1. The microchannels and/or plates can be made, for example, by laser machining, milling, punching or electroplating, and are advantageously disposed on the underside of the substrate structure, in the immediate vicinity of the power semiconductor device. Efficient thermal coupling of the power semiconductor device to the heat-exchange body is achieved by this means.

According to a preferred embodiment, an optical waveguide is optically coupled to the light-emitting power semiconductor device and guides the emitted light out of the plastic protective body.

The optical waveguide can have light-wave guidance properties that can be predefined to achieve certain ends, depending on the specific requirements or application concerned. For example, the longitudinal faces of the optical waveguide can be provided with a coating, particularly an $SiO_2$ coating.

In addition, suitable light-wave guidance can advantageously be furthered by internally structuring the optical waveguide to create a plurality of individual optical waveguides. Such structuring can be accomplished in a known manner, for example by an ion-exchange method or a planar method (lateral structuring of a light-wave-guiding core layer between two jacket layers in the optical waveguide). In accordance with the invention, with respect to an individual optical waveguide, the cross-sectional areas of the optical inlet and the optical exit can be selected so as to differ in size; and with respect to plural individual optical waveguides, the geometrical arrangement of the cross-sectional areas of the optical inlets can be configured differently from the geometrical arrangement of the cross-sectional areas of the exits. Such design measures make it possible to obtain a very specific and, if desired, predefinable light intensity distribution in the exit region of the optical waveguide.

When such an optical waveguide is provided, a process sequence that is advantageous from a production engineering standpoint is characterized by the fact that during the above-mentioned injection step the optical waveguide is completely shrouded in the plastic protective body and in a subsequent step a light exit surface of the optical waveguide is exposed in the region of the outer periphery of the marginal region, for example by breaking off a projecting piece of plastic material that is present on the plastic protective body. If a spacer (a sacrificial part) is used alternatively, instead of the optical waveguide, to create the light exit region, in this case (i.e., where a projecting piece of plastic material is present) the projecting piece of plastic material is first broken off and the spacer is then removed by being withdrawn.

Further preferred refinements of the invention are provided in the dependent claims.

The invention is described hereinbelow on the basis of a single exemplary embodiment with reference to the drawing, wherein:

DETAILED DESCRIPTION OF THE INVENTION

Figure 1:
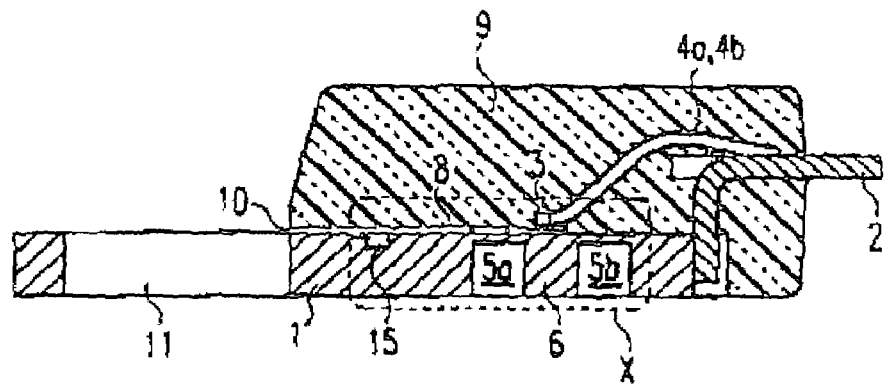
FIG. 1 is a schematic diagram of an arrangement according to the invention in a side elevation.
Figure 2:
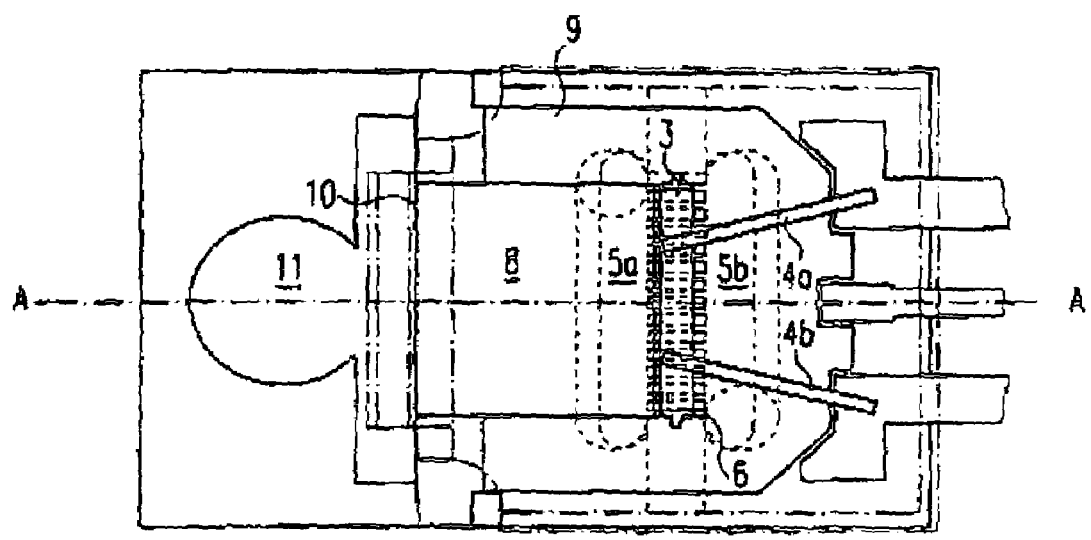
FIG. 2 is a schematic diagram of the arrangement of FIG. 1 in plan.

As depicted in FIGS. 1 and 2, an arrangement according to the invention comprises a substrate 1 made of copper. In the case of the substrate 1 shown here, this is a TO 220 lead frame, which is used as standard practice as a substrate for semiconductor transistors. Substrate 1 is connected at its one end to a metal strap 2, which contacts substrate 1 in the manner of an electrical lead and can further serve as a mechanical retaining device for substrate 1.

Mounted on one surface of substrate 1 is a power semiconductor laser 3. Substrate 1 constitutes the first electrical terminal of power semiconductor laser 3. Power semiconductor laser 3 is realized in the form of a laser bar that extends transversely with respect to a central longitudinal axis A of the arrangement, shown in FIG. 2.

On its top side, facing away from substrate 1, the bar-shaped power semiconductor laser 3 is contacted electrically by two bonding wires 4a, 4b. These bonding wires 4a, 4b constitute the second electrical terminal of power semiconductor laser 3.

Figure 3:
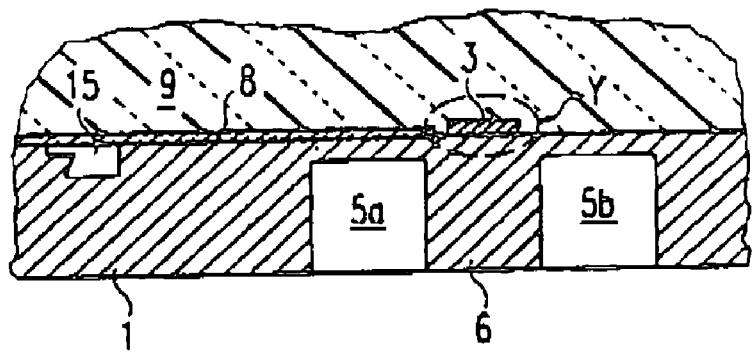
FIG. 3 is a detail X of the arrangement depicted in FIG. 1.

Substrate 1 is equipped on its underside with an integrated microcooler (see also FIG. 3). The microcooler comprises a coolant inflow channel 5a and a coolant outflow channel 5b, which extend in parallel and in projection on both sides of power semiconductor laser 3. The two coolant channels 5a, 5b are in fluid communication with each other via a heat-exchange body implemented as an integral, laminar structure. In addition to or instead of the laminar structure, other microstructures, e.g. microchannels, can be provided in the heat-exchange body. The large surface area of the plates 6 ensures a very efficient exchange of heat between the plates 6 and the coolant, particularly water, flowing through the plates 6. As a result, the waste heat transferred from the power semiconductor laser 3 to the substrate 1 (heat sink) can be carried off quickly and efficiently by the microcooler. The "floor" structure of substrate 1 extending between the power semiconductor laser 3 and the heat-exchange body can be very thin-walled and its thickness can, for example, be less than 1 mm, particularly about 0.2 mm, thus providing a short heat conduction path with little heat transmission resistance.

Power semiconductor laser 3 is realized as an edge emitter emitting in a plane parallel to central longitudinal axis A. As described in more detail hereinbelow with reference to FIG. 4, the emitted laser light is coupled by means of a cylindrical lens 7 into an optical waveguide fixed on substrate 1. The optical waveguide 8 can be made of glass and, as can be seen in FIG. 2, is implemented, for example, as an optical plate of square contour, with a width in the range of 5 to 10 mm.

According to the invention, in the embodiment shown here the arrangement formed by power semiconductor laser 3, strap 2, bonding wires 4a, 4b and optical waveguide 8 is shrouded in a plastic mass, particularly a thermoplast, forming a protective housing 9. Optical waveguide 8 is run to an edge 10 of protective housing 9. It can be implemented as a structured optical waveguide in the manner described hereinabove.

In the substrate 1 shown here (i.e., a TO 220 lead frame) there is a mounting opening 11, which in ordinary applications of the TO 220 lead frame is used for installing a transistor and thus is of no significance for the present invention.

Figure 4:
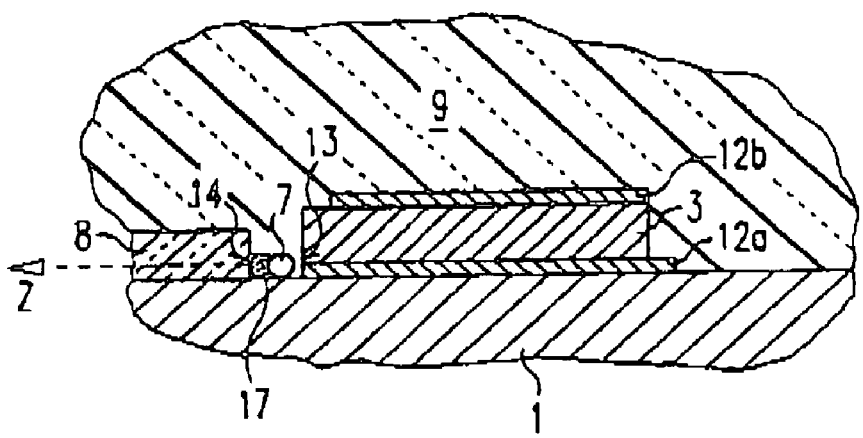
FIG. 4 is a detail Y of the arrangement depicted in FIG. 3.

FIG. 4 is an enlargement of detail Y indicated in FIG. 3. AuSn-coated, soldered Mo sheets 12a, 12b are provided between power semiconductor laser 3 and substrate 1 and between power semiconductor laser 3 and bonding wires 4a, 4b (not shown in FIG. 4). The AuSn solder coating is applied to both sides of the lower Mo sheet 12a and to at least one side of the upper Mo sheet 12b, i.e., the side facing in the direction of power semiconductor laser 3. The Mo sheets 12a, 12b serve to compensate for mechanical stresses that arise as a result of the previously discussed thermal expansion mismatch between the GaAs power semiconductor laser 3 and the Cu substrate 1 and Cu bonding wires 4a, 4b. The described construction effects the attachment of power semiconductor laser 3 to the substrate and the bonding wires 4a, 4b in a permanently mechanically and thermally stable manner. In addition, the upper Mo sheet 12b ensures that the high operating currents that occur are distributed evenly over the surface of the power semiconductor laser 3. The cylindrical lens 7 located at the emitting edge 13 of power semiconductor laser 3, in beam path Z behind the light exit, can, for example, be roughly 50 $\mu$m to 500 $\mu$m in diameter. It serves the purpose of concentrating or focusing the laser light exiting power semiconductor laser 3 at edge 13 with a given ray divergence on a light inlet surface 14 of optical waveguide 8, and is therefore spacedly disposed with respect to both edge 13 and light inlet surface 14.

The position of cylindrical lens 7 can be defined by means of two stops (not shown) that are fixed on the frame and that project, with a defined spacing, from the end faces of bar-shaped power semiconductor 3 in the direction of central longitudinal axis A past the light-emitting edge 13 of power semiconductor laser 3. Said stops fixed on the frame can, for example, be incorporated into the lower Mo sheet 12a in a manner not shown.

To fabricate the illustrated arrangement, substrate 1 is first prepared. Said substrate 1 either can be a prefabricated, separate component (a stamped part, for example), or, if lead frame technology is being used, a plurality of substrates 1 can be prepared as mounting areas in a panel-like metal sheet or a continuous metal strip (both are called lead frames). In the second case, it is advantageous that some or even all of the process steps in fabricating the arrangement according to the invention can be performed in combination, i.e., jointly on the metal sheet or metal strip (lead frame).

Power semiconductor laser 3 is then attached to substrate 1 by soldering in the previously described manner and is electrically contacted by means of bonding wires 4a, 4b.

Cylindrical lens 7 is then slid so that the regions of its axial ends are against the aforesaid stops fixed on the frame, and is fastened to the stops or to substrate 1 in this position. Thereafter—or optionally before the mounting of cylindrical lens 7—optical waveguide 8 is fastened to substrate 1 by gluing or the like. Finally, the clearance between the light inlet surface 14 of optical waveguide 8 and the cylindrical lens 7 is filled with a small drop of transparent plastic material 17, for example silicone.

In the same work step, the clearance between the light-emitting edge 13 of power semiconductor laser 3 and the cylindrical lens 7 can also be filled with the transparent plastic material 17. It is also possible to cover the aforesaid clearance or clearances or the entire region between optical waveguide 8 and power semiconductor laser 3 appropriately in such a way that the plastic protective housing 9 forms a cavity (i.e., an air chamber) there. The aforesaid measures prevent plastic material from the protective housing 9 from entering the beam path during the injection step and interrupting or shadowing said path.

In an ensuing step, the protective housing 9 is put in place. The placement of the protective housing 9 is performed by direct injection, for example with an opaque thermoplastic material at a pressure of 80 to 110 bars and a process temperature of 180° C. An anchoring recess 15 on the substrate 1, shown in FIGS. 2 and 3, is also filled with thermoplastic material at this time. The hardening can be carried out at 175° C. and takes about two hours. Other production parameters are also possible, depending on the plastic material used. The protective housing 9 is then fixedly connected to substrate 1 via anchoring recess 15. To form a nondetachable connection, anchoring recess 15 can be provided with retaining teeth.

Glass particles are preferably incorporated into the liquid thermoplast before the injection step to favorably affect its thermomechanical properties.

Figure 5:
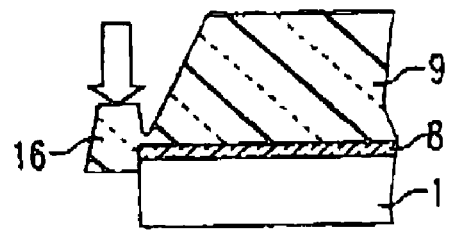
FIG. 5 is a schematic diagram to clarify the exposure of the end face of an optical waveguide.

After the injection step, a light exit surface of the optical waveguide 8 is exposed at the peripheral region of protective housing 9. As shown in FIG. 5, to this end, protective housing 9 is provided with a projecting piece 16 of plastic material that shrouds an end region of optical waveguide 8. The light exit surface can be produced merely by breaking off or cutting off the projecting piece 16 of plastic material. The light exit surface can also optionally be polished subsequently to enhance its optical quality.

If the arrangement according to the invention is to be implemented without an optical waveguide 8, a spacer whose shape substantially matches that of the optical waveguide 8 is used in its place prior to the injection step. The spacer is removed after the injection step and leaves a complementarily shaped light exit channel in the housing.

If the aforesaid process steps have been performed for plural arrangements according to the invention in common on a lead frame, this lead frame is then (or optionally earlier, at a suitable prevention time) separated, in a separation step, into the individual mounting areas forming substrate 1. The separation can be done, for example, by means of a stamping, laser-cutting or etching step.

The arrangement according to the invention can have different output characteristics, as may be required. Typically, a 10 W power semiconductor laser (useful optical output) with operating currents in the range of 20 to 40 A is used. Up to 120 liters of water per hour can be used to carry off the waste thermal power, which in this example amounts to about 20 to 40 W. High useful optical outputs of 20 W or more can also be achieved with the arrangement according to the invention.

The arrangement according to the invention can be used in many technical fields, it being envisaged in particular as a high-power pumped light source for an Nd:YAG or Yt:YAG laser.

What is claimed is:

1. An arrangement comprising a light-emitting power semiconductor device disposed on a metallic substrate structure and comprising a plastic protective body, which is formed by injection onto said substrate structure and shrouds said power semiconductor device substantially form-fittingly on the sides and top thereof, leaving a light exit region exposed, and comprising an optical waveguide that is coupled to said light-emitting power semiconductor device and that guides the emitted light out of said plastic protective body, wherein the region between said light-emitting power semiconductor device and said optical waveguide is filled, at least segmentally, with a transparent plastic material that contacts the light exit region of the power semiconductor device.

2. The arrangement as recited in claim 1, wherein filler particles are dispersed in
said plastic protective body.

3. The arrangement as recited in claim 2, characterized in that
said filler particles are present in order to adjust the thermomechanical properties of the material of said plastic protective body to the thermal expansion of said power semiconductor device.

4. The arrangement as recited in claim 3, characterized in that
the filler particles are glass particles.

5. The arrangement as recited in claim 1, characterized in that
said plastic protective body is made of a substantially opaque plastic material.

6. The arrangement as recited in claim 1, characterized in that
said plastic protective body is made of a thermoplast or a duroplast.

7. The arrangement as recited in claim 1, characterized in that
said substrate structure is a singulated part made from a panel-shaped or strip-shaped metal sheet.

8. The arrangement as recited in claim 7, characterized in that
said substrate structure is a singulated part.

9. The arrangement as recited in claim 7, characterized in that
said substrate structure is made from a lead frame.

10. The arrangement as recited in claim 1, characterized in that
said substrate structure is in thermal contact with a coolant which flows around or across at least a portion of its surface.

11. The arrangement as recited in claim 10, characterized in that said substrate structure is provided with a heat-exchange body comprising microchannels and/or microplates.

12. The arrangement as recited in claim 11, characterized in that
said heat-exchange body is disposed in the immediate vicinity of said power semiconductor device, on the side of said substrate structure facing away from said power semiconductor device.

13. The arrangement as recited in claim 10, characterized in that
said coolant is water.

14. The arrangement as recited in claim 1, characterized in that
said optical waveguide is provided on both of its longitudinal faces with a coating for beam guidance.

15. The arrangement as recited in claim 14, characterized in that
said coating is a $SiO_2$ coating.

16. The arrangement as recited in claim 1, characterized in that
an optical waveguide structure creating a plurality of individual optical waveguides is formed in said waveguide.

17. The arrangement as recited in claim 16, characterized in that
with respect to an individual optical waveguide, the cross-sectional areas of the optical inlet and the optical exit differ in size, and/or, with respect to plural individual optical waveguides, the geometrical arrangement of the cross-sectional areas of the optical inlets is different from the geometrical arrangement of the cross-sectional areas of the exits.

18. The arrangement as recited in claim 1, characterized in that
to effect the optical coupling of said optical waveguide to said light-emitting power semiconductor device, a particularly reflective or diffractive lens is provided in the beam path between said power semiconductor device and said optical waveguide.

19. The arrangement as recited in claim 18, characterized in that
said lens realized as a cylindrical lens.

20. The arrangement as recited in claim 1, characterized in that
said transparent plastic material is silicone.

21. The arrangement as recited in claim 1, characterized in that
said light-emitting power semiconductor device is a semiconductor laser.

22. The arrangement as recited in claim 21, characterized in that
said light-emitting power semiconductor device is a semiconductor laser bar.

23. A method for fabricating an arrangement comprising a light-emitting power semiconductor device, wherein the method comprises:
in a first step, said light-emitting power semiconductor device is placed against and electrically contacted by a substrate structure, and
in a second step that can be performed chronologically before or after the first step, an optical waveguide is affixed to said substrate structure, and
in a third step, said substrate structure with said light-emitting power semiconductor device is injection-coated with a plastic mass forming a plastic protective body,
wherein said optical waveguide including an exit end of the optical waveguide is completely shrouded in said plastic protective body, and
in a fourth step, removing the portion of the plastic protective body that covers the exit end of the optical waveguide to expose a light exit surface of said optical waveguide at the exit end.

24. The method as recited in claim 23, characterized in that
said substrate structure is realized, at least in said first step, as a mounting area in a planar metal sheet, and the separation of the metal sheet into the individual arrangements is effected in a subsequent singulating step.

25. The method as recited in claim 23, characterized in that
as part of the fourth step, a projecting piece of plastic material integrally formed on said plastic protective body is broken off to expose said light exit surface of said optical waveguide.

26. The method as recited in claim 23, characterized in that
after said fourth step, the exposed light exit surface of said optical waveguide is polished.

* * * * *

UNITED STATES PATENT AND TRADEMARK OFFICE
CERTIFICATE OF CORRECTION

| | | |
|---|---|---|
| PATENT NO. | : 6,960,033 B1 | Page 1 of 1 |
| APPLICATION NO. | : 09/786699 | |
| DATED | : November 1, 2005 | |
| INVENTOR(S) | : Bruno Acklin, Stefan Grötsch and Werner Sp„th | |

It is certified that error appears in the above-identified patent and that said Letters Patent is hereby corrected as shown below:

Title Page #57
Abstract, line 2, replace "metillic" with --metallic--

Signed and Sealed this

Twenty-ninth Day of August, 2006

JON W. DUDAS
*Director of the United States Patent and Trademark Office*